United States Patent
Lau et al.

[11] Patent Number: 6,002,260
[45] Date of Patent: Dec. 14, 1999

[54] FAULT SENSOR SUITABLE FOR USE IN HETEROGENOUS POWER DISTRIBUTION SYSTEMS

[75] Inventors: Ken Lau, San Francisco; Rodger Mayeda, Cottonwood; Julian Riccomini, Pleasanton; Mary Ilyin, Walnut Creek, all of Calif.

[73] Assignee: Pacific Gas & Electric Company, San Francisco, Calif.

[21] Appl. No.: 08/935,638

[22] Filed: Sep. 23, 1997

[51] Int. Cl.⁶ .................................................. G01R 31/08
[52] U.S. Cl. ........................... 324/522; 324/509; 361/65; 364/528.21
[58] Field of Search ..................... 324/509, 522, 324/537, 539, 543, 115, 126, 127, 133; 340/650, 651, 657, 662, 663, 664; 361/63, 65, 79, 86–88, 93, 95–97; 364/528.21, 528.22, 528.27, 528.28

[56] References Cited

U.S. PATENT DOCUMENTS

| | | |
|---|---|---|
| 5,517,423 | 5/1996 | Pomatto ............................ 364/528.21 |
| 5,547,514 | 8/1996 | Ward et al. ............................ 134/22.1 |
| 5,550,476 | 8/1996 | Lau et al. ............................ 324/522 |
| 5,565,783 | 10/1996 | Lau et al. ............................ 324/522 |
| 5,656,931 | 8/1997 | Lau et al. ............................ 324/522 |
| 5,839,093 | 11/1998 | Novosel et al. ................... 364/528.27 |

*Primary Examiner*—Diep N. Do
*Attorney, Agent, or Firm*—Burns, Doane, Swecker & Mathis LLP

[57] ABSTRACT

A fault sensor suitable for use in a heterogenous power distribution system executes a stored program and causes sufficient information to be collected to distinguish a source of fault current as being from a public utility portion of the power distribution network or from a distributed generator. Short circuit current and magnetizing current are reliably distinguished based on differences in VI "signatures." In addition, the fault sensor periodically senses a condition of a battery of the fault sensor. When the condition of the battery indicates the battery power is low, the fault sensor sends a digital data signal including a low battery indication to a remote location. Subsequent to occurrence of a sustained power outage, the sensor detects that power has been restored and sends to a remote location a digital data signal including an indication that power has been restored. The sensor periodically measures peak line voltage and peak line current and reports peak values to the remote location.

24 Claims, 12 Drawing Sheets

FAULT SENSOR SUITABLE FOR USE IN HETEROGENOUS POWER DISTRIBUTION SYSTEMS

BACKGROUND OF THE INVENTION

1. Field of the Invention

The present invention relates to fault sensors for use in power distribution systems, particularly to fault sensors having telecommunications capability.

2. State of the Art

In the field of power transmission and distribution, generating systems produce electrical power which is transmitted through a grid of electrical high voltage alternating-current (AC), three-phase power lines. Occasionally, a transmission or distribution power line experiences a fault in which, for example, a short circuit or equipment failure on a power line causes a circuit breaker to trip open, causing a power interruption to the customer. Other faults, in particular high impedance faults, can occur when a power line falls onto a high-impedance surface, such as dry grass or an asphalt road, but the wire remains energized because the high impedance surface insulates the down wire to prevent it from generating enough short circuit current to trip the circuit breaker. Or, a down wire may be backfeeding from a service transformer. The backfeeding current will never be high enough to trip the substation protective relay. Another type of voltage problem occurs in a typical three-phase three-wire distribution system where service transformers are delta connected, when there is an open circuit on one of the power lines causing extremely low voltage to the customers located beyond the open circuit.

Various fault sensors have been proposed to detect and report power line faults. One such fault sensor is disclosed in U.S. Pat. No. 5,550,476 of the present assignee, incorporated herein by reference. The fault sensor described in the foregoing patent is microprocessor-based and is provided with a detection algorithm that allows the fault sensor to intelligently distinguish between various different kinds of faults, including momentary outage, sustained outage, overload, inrush, an open line on one to three phases of the circuit with the possibility of a live line on the ground, and voltage sag.

The foregoing fault sensor functions well according to its intended purpose in a homogeneous power distribution system. Presently, however, the power industry is entering an era of deregulation comparable to the deregulation experienced by the telecommunications industry in the 1980's. As a result, the power distribution system will increasingly become a heterogenous system as compared to the homogeneous system of today.

Figure 1:
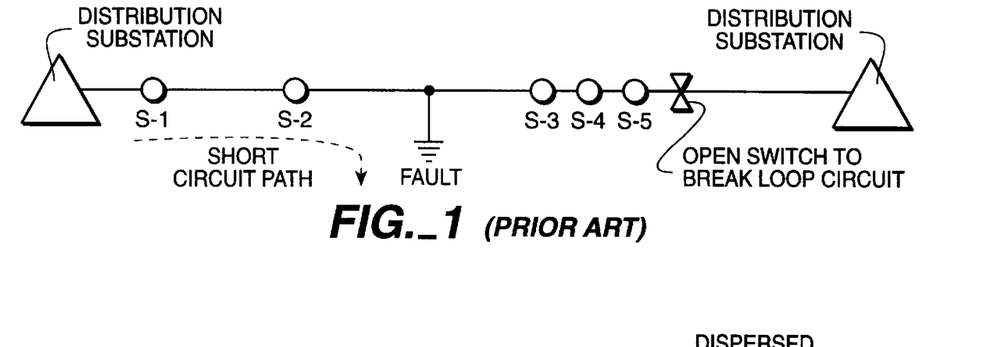
FIG. 1 is an illustration of a faulted conventional distribution radial system with fault sensors.

More particularly, a conventional distribution circuit usually has only one power source. Although a distribution circuit may be tied to other circuits originating from other substations, switches between the circuits are opened to prevent parallel circuit operation. This type of distribution system is referred to as a radial system. Prior art fault sensors are designed to detect and identify a faulted line section based on the conventional radial distribution system configuration. Presently, utility operators can identify faulted line sections by tracing tripped fault sensors which have detected the flow of short circuit current. Short circuit current is usually an order of magnitude higher than normal load current. This system only works when there is one supply source per circuit, as is illustrated in FIG. 1, which is typically how the distribution lines are configured today. In FIG. 1, fault sensors S-1 and S-2 are tripped by fault current. The fault location is between the last in a series of tripped fault sensors (S2) and the first normal state fault sensor (S3).

As the utility industry is deregulated, small, dispersed generators are expected to be installed on the distribution system to compete with central generation by the power utility. Distribution circuits with generators are substantially different from radial or single-power-source systems. With conventional fault sensors, in the event of a circuit failure, short circuit current contributed from the substation and the distributed generators will cause all the fault sensors that are on the circuit between distribution substations and distributed generators to trip. As a result, utility operators will no longer be able to locate the faulted line section by tracing the trip fault sensors if the fault occurs between a substation and a distributed generator. Conventional fault sensors are therefore not suitable for use in a heterogenous, multiple-source distribution system.

Figure 2:
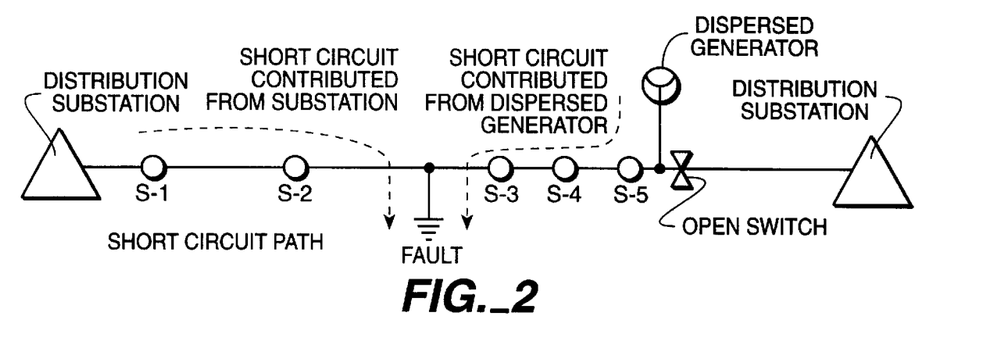
FIG. 2 is an illustration of a faulted distribution radial system with distributed generation and fault sensors.

Interconnection of generators on the distribution circuit will cause conventional prior-art fault sensors to become obsolete. This situation is illustrated in FIG. 2. As seen in FIG. 2, if the same circuit has a distributed generator interconnected to the circuit then a different situation arises than in FIG. 1. All five fault sensors on the circuit will detect short circuit current and thus will be triggered. In particular, fault sensors S-1 and S-2 are tripped by fault current contributed by the substation, and fault sensors S-3, S-4 and S-5 are tripped by fault current contributed by the generator. As a result. operators cannot identify the faulted line section by tracing the tripped fault sensors.

Conventional fault sensors also suffer from further disadvantages. Retaining sensor integrity over the life of the sensor is key to minimizing operation and maintenance cost. In the prior art, in order to monitor line current and voltage field and transmit information relating to the faults occurring on a distribution line, conventional batteries were used to power a microprocessor and a transmitter. The problem arises with such prior art devices that the conventional batteries become exhausted over a short period of time and require replacement or recharging. To manage such conventional battery maintenance and/or replacement at thousands of remote sensing locations has involved considerable expense and has often resulted in failure to detect faults over significant periods of time. Inspecting battery condition in these prior-art devices to insure reliable and proper operation becomes a major maintenance effort.

Another problem with prior fault sensors is that most fault sensors clear themselves from the fault signal after a pre-determined time, e.g., four hours. After the fault signal has been cleared, no information is provided as to whether power has been restored to the line. Consequently, troublemen and linemen do not know if there is still a sustained outage or if power has been restored.

What is needed therefore is a fault sensor which can detect faults on a distribution system with distributed generators. The fault sensor should provide for a power-restore signal and, in addition, a low-battery alarm so that maintenance of the sensor can be done on an as-needed basis in a timely manner without implementing a labor-intensive inspection program. The present invention addresses these needs.

SUMMARY OF THE INVENTION

The present invention, generally speaking, provides a fault sensor suitable for use in a heterogenous power distribution system. The fault sensor executes a stored program and causes sufficient information to be collected to distinguish a source of fault current as being from a public utility portion of the power distribution network or from a distributed generator. In addition, the fault sensor periodically senses the battery condition of the fault sensor. When the condition of the battery indicates the battery power is low, the fault sensor sends a digital data signal including a low battery indication to a remote location. In accordance with a further aspect of the present invention, subsequent to occurrence of a sustained power outage, the sensor detects that power has been restored and sends to a remote location a digital data signal including an indication that power has been restored.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 3:
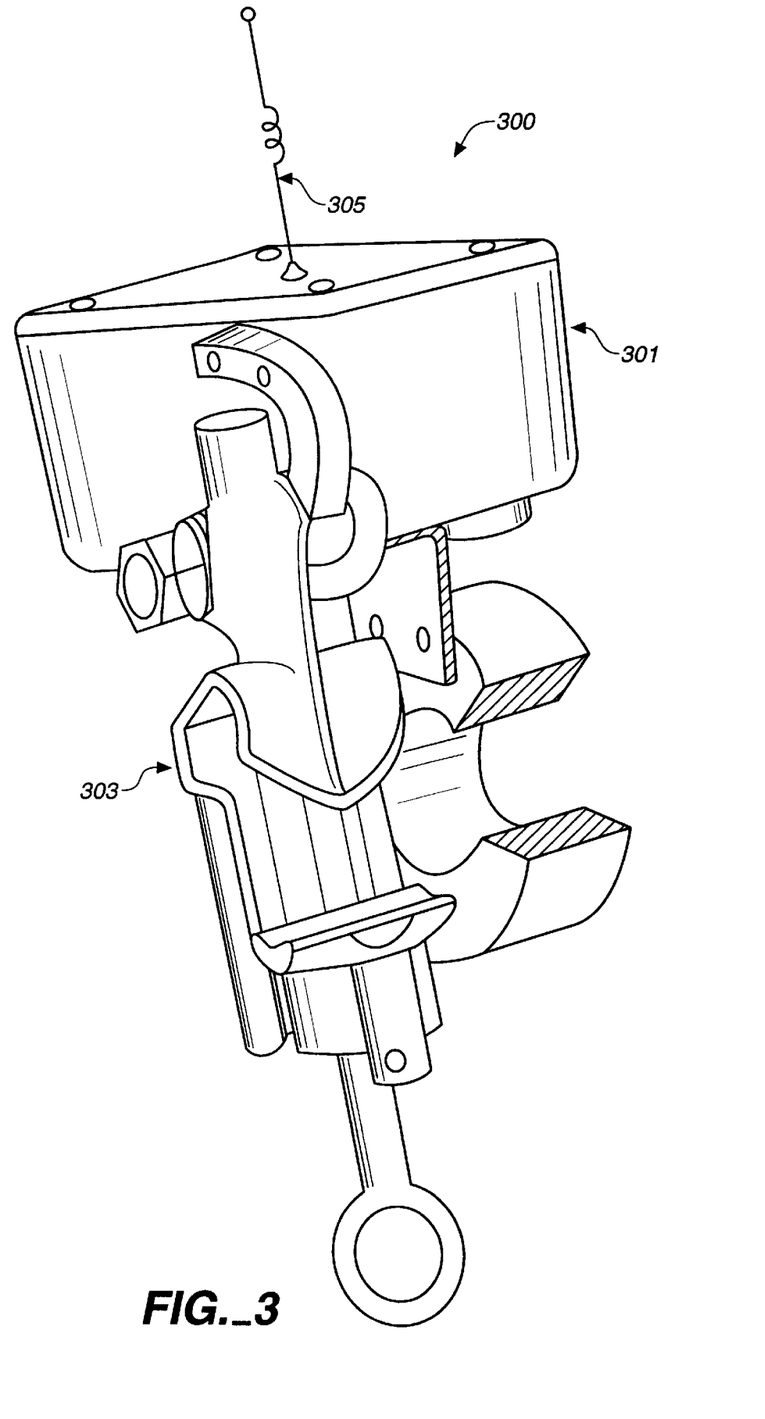
FIG. 3 is a perspective view of one embodiment of the present fault sensor.

Referring now to FIG. 3 a perspective view is shown of a fault sensor 300 in accordance with one embodiment of the present invention. The fault sensor can be easily attached to a distribution power line. Unlike certain prior-art fault sensors, no iron collar is needed to power the fault sensor of FIG. 1. Rather, circuitry used to sense and transmit an alarm condition is battery powered and is therefore operational regardless of whether current is flowing in the power line. Fixed to the housing 301 is a clamp assembly having a jaw portion 303 adapted to extend at least partially around the circumference of the power line. The clamp assembly is compatible with standard industry installation tools.

The sensing device is comprised of an elongated housing 301 formed from extruded or otherwise-processed plastic or aluminum. The housing, if it is made of plastic, is preferably electrically shielded. An external antenna 305 may be provided, in which case the entire plastic housing may be shielded. Alternatively, an internal antenna may be provided, in which case the plastic housing is electrically shielded except where the internal antenna is located.

Inside the housing is a small card cage and a battery compartment. In an illustrative embodiment, the card cage accommodates multiple printed circuit board cards, including an analog data-acquisition card, a digital processing card and a radio communications card. Preferably, the fault sensor employs a long-life lithium battery. Although the fault sensing device has been illustrated in FIG. 1 as an overhead device, an underground sensing device may be provided in a similar manner as described in greater detail in U.S. Pat. No. 5,550,476.

In operation, the fault sensor continuously measures line current and compares the measured line current to a programmed trigger level. Voltage field measurements are also made to assist in determining the type of current fault condition which occurred on the distribution line. In the event of a current fault condition, the device is triggered by a surge of current, and then the microprocessor checks the voltage field to determine if an outage, inrush, overload or disturbance condition occurred. If the type of fault is sustained, momentary or overload, then pertinent information is sent back to a main station or a repeater station. If the fault is an inrush or there is a disturbance on the line, then this information is stored and is only transmitted in conjunction with a daily health check. In the daily health check, information which is transmitted includes five-minute-average current and voltage measurement data, peak measured current and battery voltage.

Aside from measuring current, the voltage field is also periodically measured and updated to establish a reference level. The voltage field is compared to the voltage field measurement from the previous time frame. If the voltage measurement is $\geq 15\%$ of the previous reading, a previous reference value is retained as the nominal voltage. If not, then the measured value is used to calculate a weighted average, which becomes the updated reference voltage value.

Figure 4:
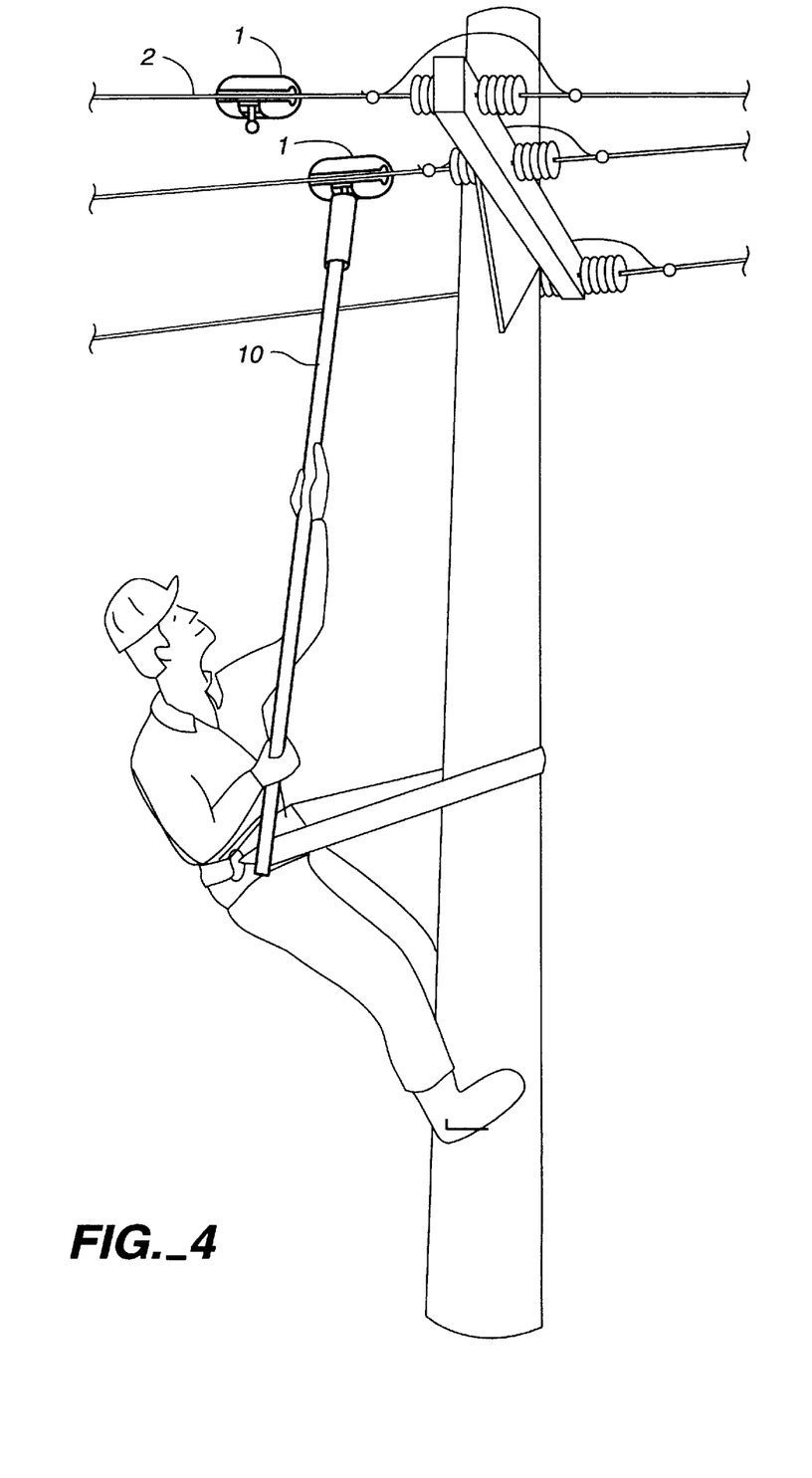
FIG. 4 is an illustration depicting installation of the fault sensor of FIG. 3.

As shown in FIG. 4, the fault sensor is mounted on an energized overhead powerline easily and quickly by means of a so-called "hot stick" 10 manipulated by an individual in a bucket truck, or from a power line pole. The hot stick 10 includes a "shotgun" internal attachment mechanism which attaches to the eyescrew of the overhead fault sensor 1. To attach the overhead fault sensor 1, the hot stick 10 is attached first to the sensor. Then the sensor is mounted on the overhead power line 2 and the handle of the hot stick 10 is turned, thereby attaching the device to the overhead power line 2. When the overhead device 1 has been mounted, the shotgun internal attachment mechanism is deactivated and the hot stick 10 is detached from the device. Reinserting the hot stick and turning it in the opposite direction will open the clamp assembly and allow the overhead fault sensor 1 to be removed from the overhead transmission or distribution power line 2. This attachment and removal feature provides flexibility and efficiency in placing the fault sensors in the transmission and distribution system.

Figure 5:
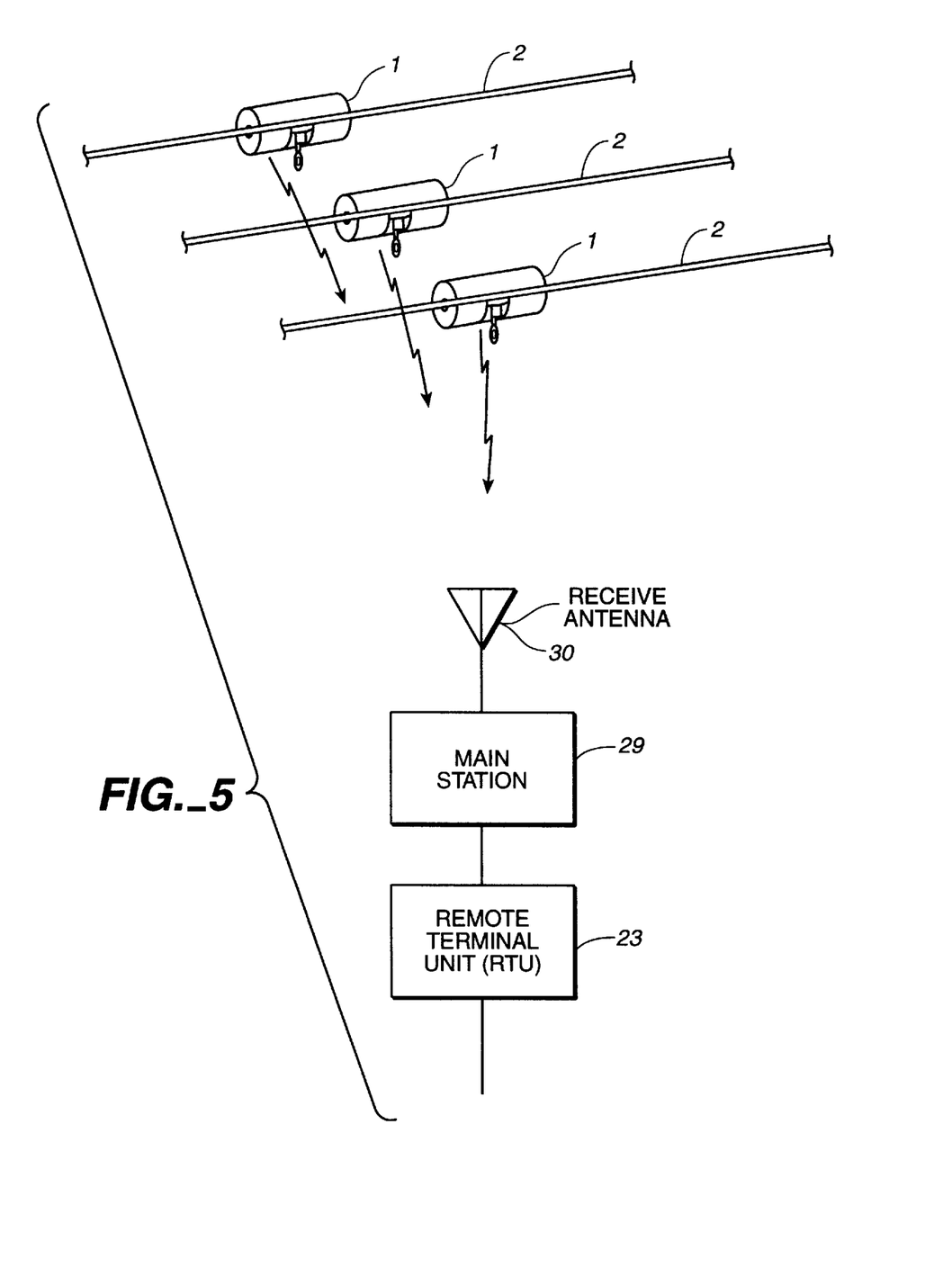
FIG. 5 is a perspective view of three fault sensors, each having radio transmission capabilities, installed on three adjacent power lines.

FIG. 5 illustrates how the sensors interact with the load center or any designated main station 29. Hundreds of sensor devices can communicate with one main station 29 at a designated location. At the designated location there is an antenna 30 with either a transceiver or a SCADA RTU 23 which receives the information from the devices. The information it receives includes the sensor identification, alarm condition and possibly the waveforms prior, during and after a voltage fault. The main station 29 will also receive a sensor device status report on a predetermined regular schedule from each sensor device as to the device's functionality. Optionally, during this reporting interval, the sensor device can also be reprogranmmed.

Figure 6:
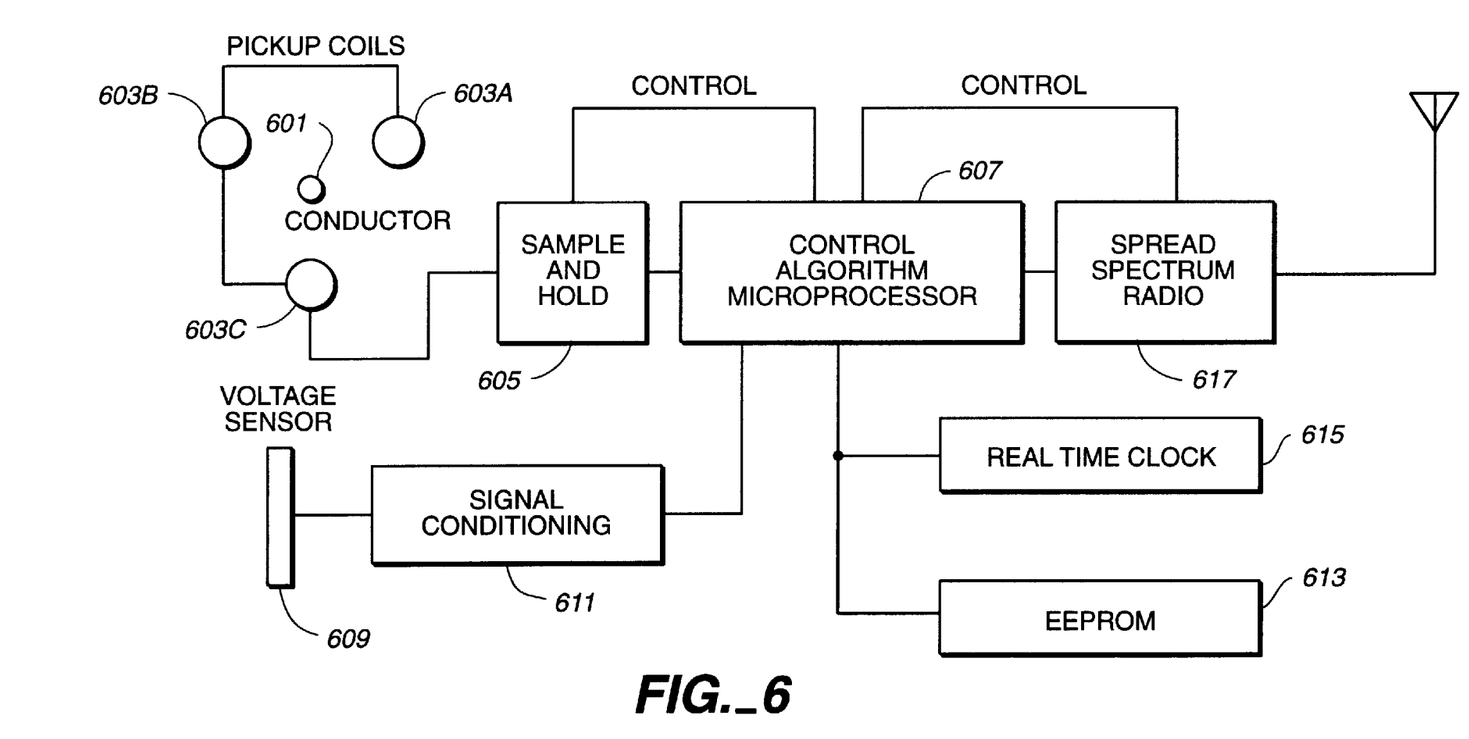
FIG. 6 is a block diagram of the fault sensor of FIG. 1.

Referring to FIG. 6, a block diagram of the fault sensor is shown. The overhead fault sensor is provided with three current coils 603A, 603B and 603C, which are fixed in the housing at about 120° angles from each other around the conductor 601. The three current coils measure the voltage across the coils which is proportional to the line current. These three coils are connected in series and allow the current to be measured with an accuracy within 1%. This multiple coil configuration is insensitive to conductor wire size and the adjacent magnetic fields generated by the current on the nearby conductors. The reason the sensor is insensitive to the adjacent conductors is that their magnetic fields cancel in the three series-connected coils. In the case of an underground fault sensor, a four-to-six coil configuration is preferably used, since underground conductors are very close to each other.

A peak sample-and-hold unit 605 is used to sample the level of current flowing through the pick-up coils. Samples are input to a microprocessor 607, which controls the peak sample-and-hold unit. Similarly, a voltage sensor 609 senses the voltage field of the conductor. The voltage signal is conditioned within a signal conditioning block 611 and input to the microprocessor 607. The microprocessor operates in accordance with a program stored in PROM 613. A real-time clock 615 is provided to allow the time-of-occurrence of fault events to be reported.

Reporting may be performed by either wired (including fiber optics) communications or wireless communications. In the illustrated embodiment, reporting is performed by wireless communications using a radio 617. The radio may be a spread spectrum radio, for example, in order to achieve robust communications in the presence of noise and interference.

The fault sensor is operable with both single- and multiple-power-source systems. In the case of a multiple-power-source system, the microprocessor operates in accordance with an algorithm, described hereinafter, that is able to identify the faulted line section by counting the number of breaker reclosures and determining the short circuit current level and direction. The short circuit current originating from a utility substation has a higher current level than that from a distributed generator and the short circuit current for the generator is reversed. With the additional information of the number of reclosing actions (a distributed generator has no reclosing actions), it is possible to determine if the fault originated from the utility or from a distributed generator. The faulted line section can then be identified as the line section between the last sensor which detected high short-circuit current with reclosing actions and the first sensor which detected lower short-circuit current without reclosing action.

With the information provided by the fault sensor, operators can respond to sustained outage faults promptly and appropriately. For a sustained outage alarm, operators can promptly isolate the problem and restore service to the affected customers. For an overload alarm, operators may execute load transfers to relieve the overloaded line section. For a momentary outage alarm, operators may dispatch line patrolmen to identify the possible cause of the trouble, such as tree branches getting close to the power line, and schedule a maintenance crew to correct the problem. For an inrush alarm or a disturbance on the line, operators may refer the problem to engineers who will devise remedial action to correct the deficiency.

The present sensing device also sends a power-restore signal to the dispatch operator, system operator or designated main station computer after it detects restored power. This information is valuable to the linemen and troublemen so that they are able to know if a line is energized and power has been restored.

An important capability of the present fault sensor is that of providing sufficient information to allow a faulted line section to be identified in a heterogenous power distribution system. In the situation of FIG. 2, the present fault sensor with the algorithm as described hereinafter is able to identify the faulted line section to be between fault sensor S2 and fault sensor S3. In order to provide this capability, the fault sensor counts the number of times the current is at zero within a predetermined period after exceeding the trigger level. From this information, the number of reclosures can be determined.

Figure 7:
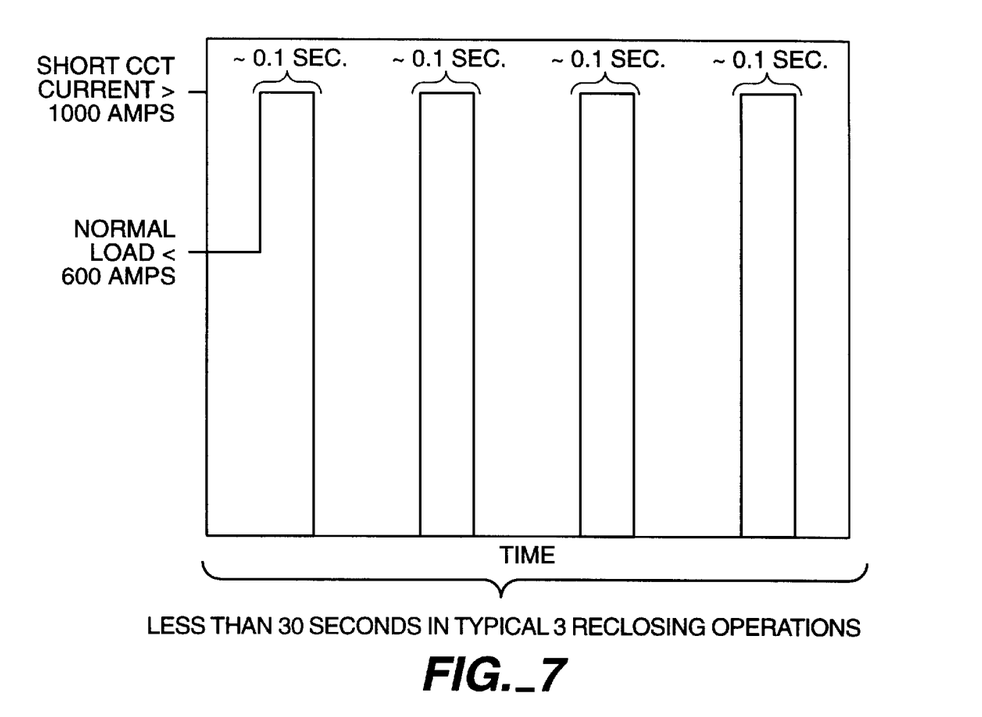
FIG. 7 is an illustration of a substation short-circuit reclosing sequence.
Figure 8:
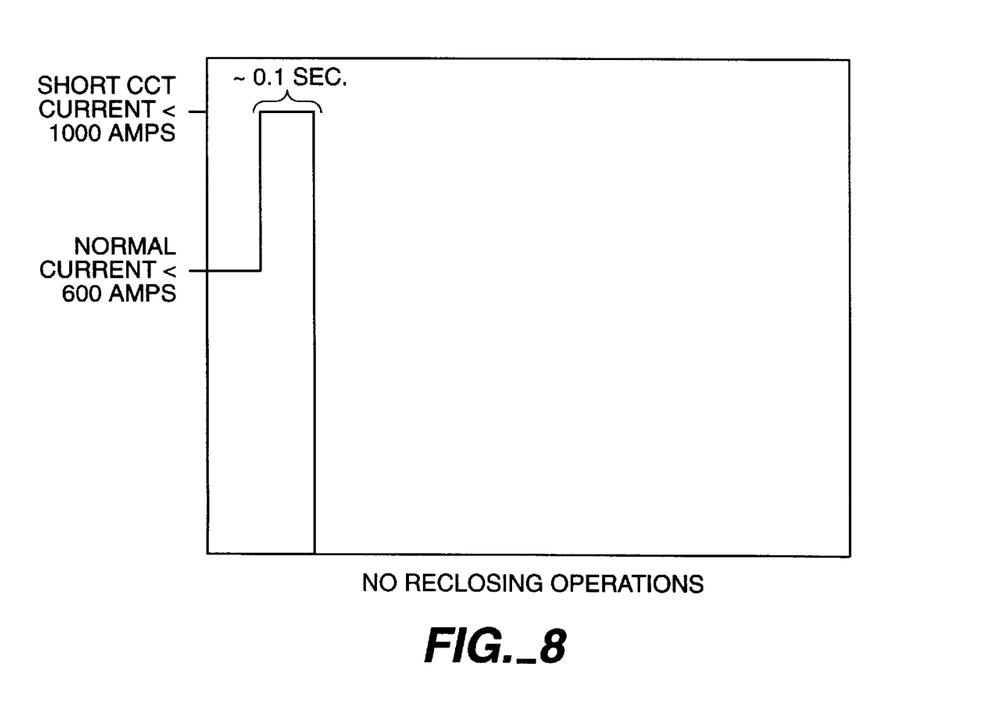
FIG. 8 is an illustration of a distributed generator short circuit (no reclosing)

Substation reclosers typically have at least one reclosing operation as illustrated in FIG. 7, while a distributed generator breaker has no reclosing action as illustrated in FIG. 8. In addition, the short circuit current level created by a distribution power line and substation system is typically over a thousand amps, whereas the short circuit current level contributed by a distributed generator is typically in the range of a thousand amps or less and the direction of the current is reversed. Therefore, the fault sensors at locations S1 and S2 will detect reclosing actions and a large short circuit current level. The fault sensors at locations S3, S4 and S5 will detect no reclosing action and small short circuit current levels and a reversed current direction. The latter fault sensors will identify the short-circuit current to have originated from the distributed generator on the distribution line. From this information, the faulted line section in FIG. 2 may be easily identified as being between S2 and S3.

Figure 9:
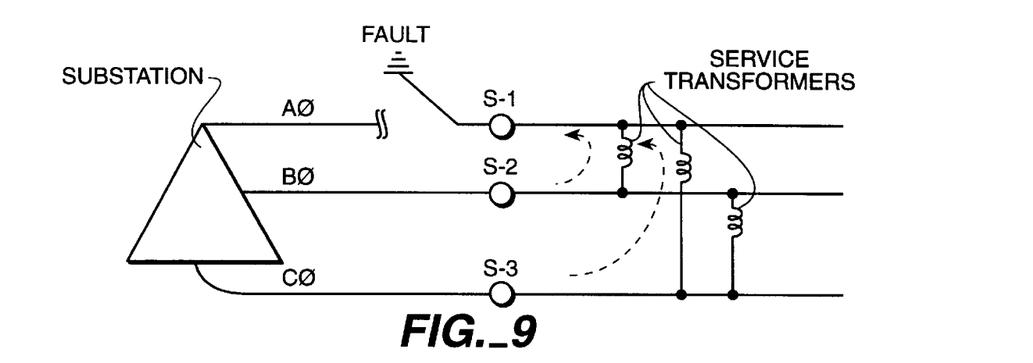
FIG. 9 is an illustration of the sensor's ability to detect high impedance faults caused by backfeeding.

The present sensor is provided with an algorithm that is able to detect an energized down power line caused by power backfeeding through a service transformer. If a distribution circuit with service transformers is connected in a line-to-line or delta configuration (especially a three wire system with no neutral) and an energized overhead line drops to the ground, then circuit protection devices will be unable to identify this hazardous situation and de-energize the line. This is because the energized line is being backfed from the source through a transformer and there is no short circuit current to trip the circuit protection devices. This energized line on the ground poses an extremely hazardous condition for the public, because the residual voltage on the down wire can be a few thousand volts. Referring to FIG. 9, when there is an energized line on the ground, the fault sensor S1 will detect that the line voltage on the downed wire is below 35% of the nominal level. The fault sensor also detects the presence of current. The fault sensor therefore is in a backfeeding situation. Normally, if the line voltage measured by the voltage sensor is less than 35% of the nominal value for a period of time longer than several minutes and there is no current, then the line is defined as de-energized.

Figure 10:
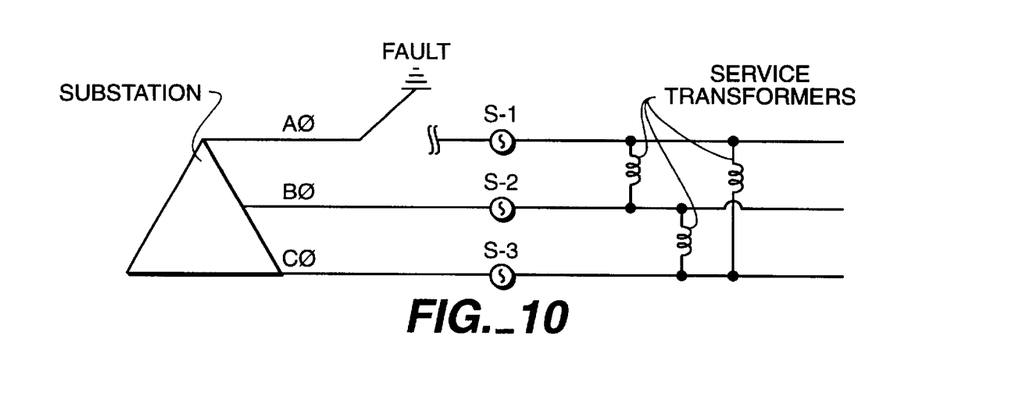
FIG. 10 is an illustration of the sensor's ability to detect open wire faults.

FIG. 10 depicts an open-wire fault condition with the possibility of high impedance fault. In this situation the voltage is between approximately 35% and 85% of nominal voltage. This occurs when the line falls on a high-impedance surface such as dry grass or thick asphalt. The voltage on the open phase drops roughly 50% but is normal on the other two phases. The fault sensor S1 will detect the open-wire situation.

Figure 11:
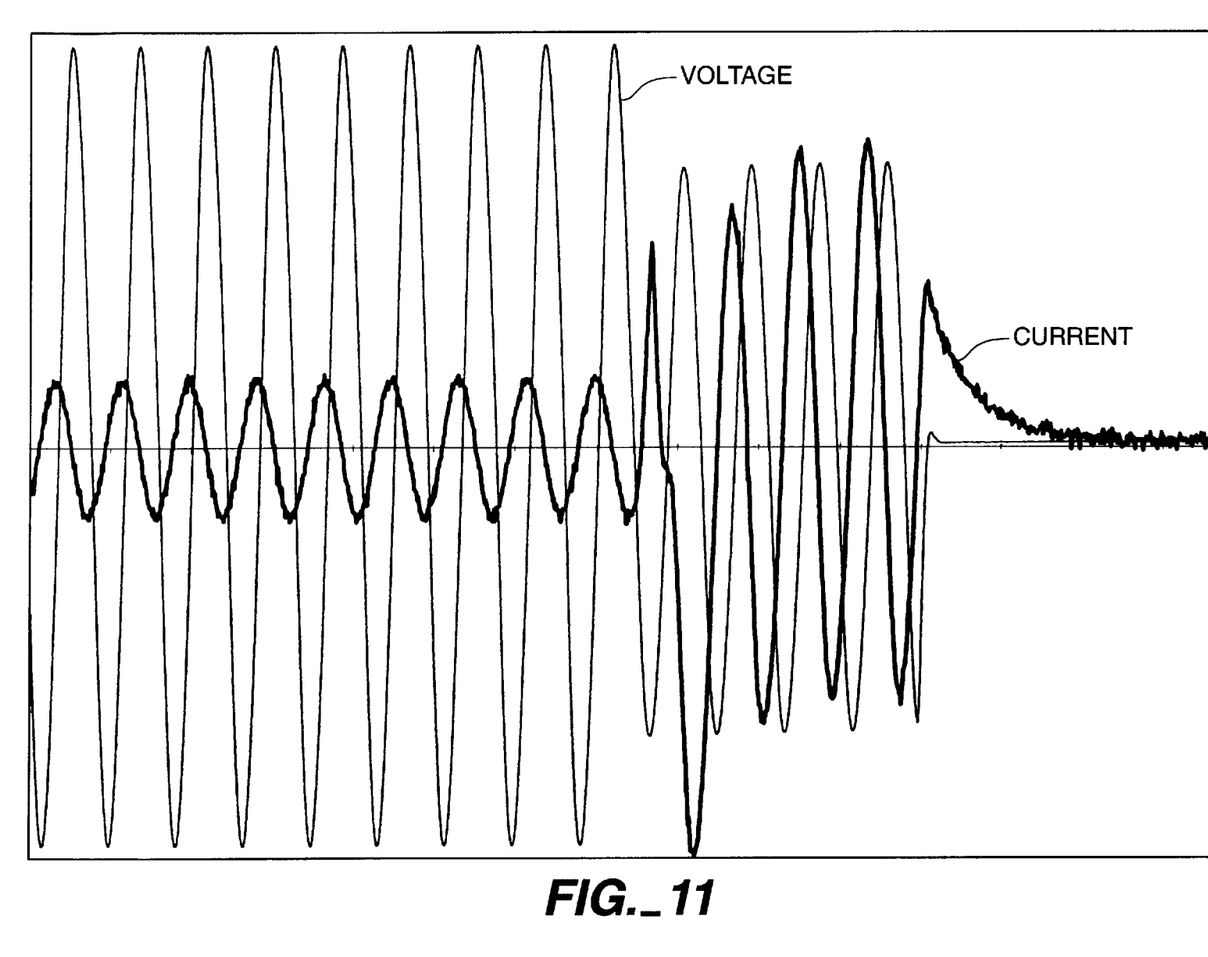
FIG. 11 is an illustration of short-circuit current and voltage-field signatures.
Figure 12:
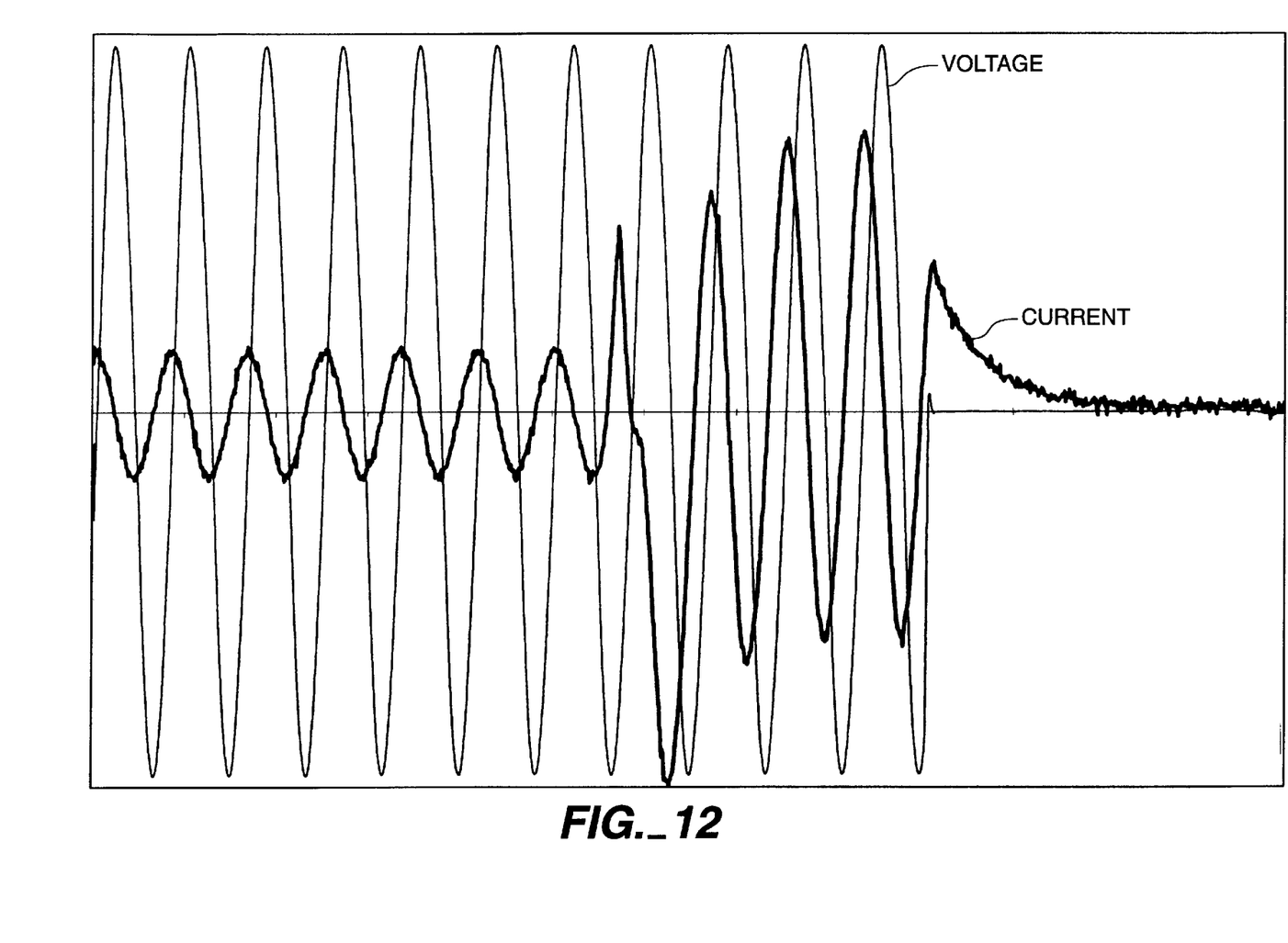
FIG. 12 is an illustration of magnetizing-current and voltage-field signatures.

The fault sensor also has the ability to detect and distinguish between short-circuit current and magnetizing current by using voltage field and current signatures. As shown in FIG. 11, the fault sensor detects short circuit current by detecting a sudden increase in current (dark trace) and decrease in voltage field level (lighter trace). This condition must persist for up to a few cycles if the line is to trip. Magnetizing current can be generated at the moment when transformers are re-energized after a power restore. When the power comes back to energize the service transformers, the magnetizing current can be twenty times the transformer's nameplate rating. The surge of current can be mistaken for short-circuit current by conventional fault sensors. Since the magnetizing current has a sudden increase of current but the voltage field does not decrease as shown in FIG. 12, the present fault sensor can detect and distinguish between the two conditions.

Figures 13, 13A:
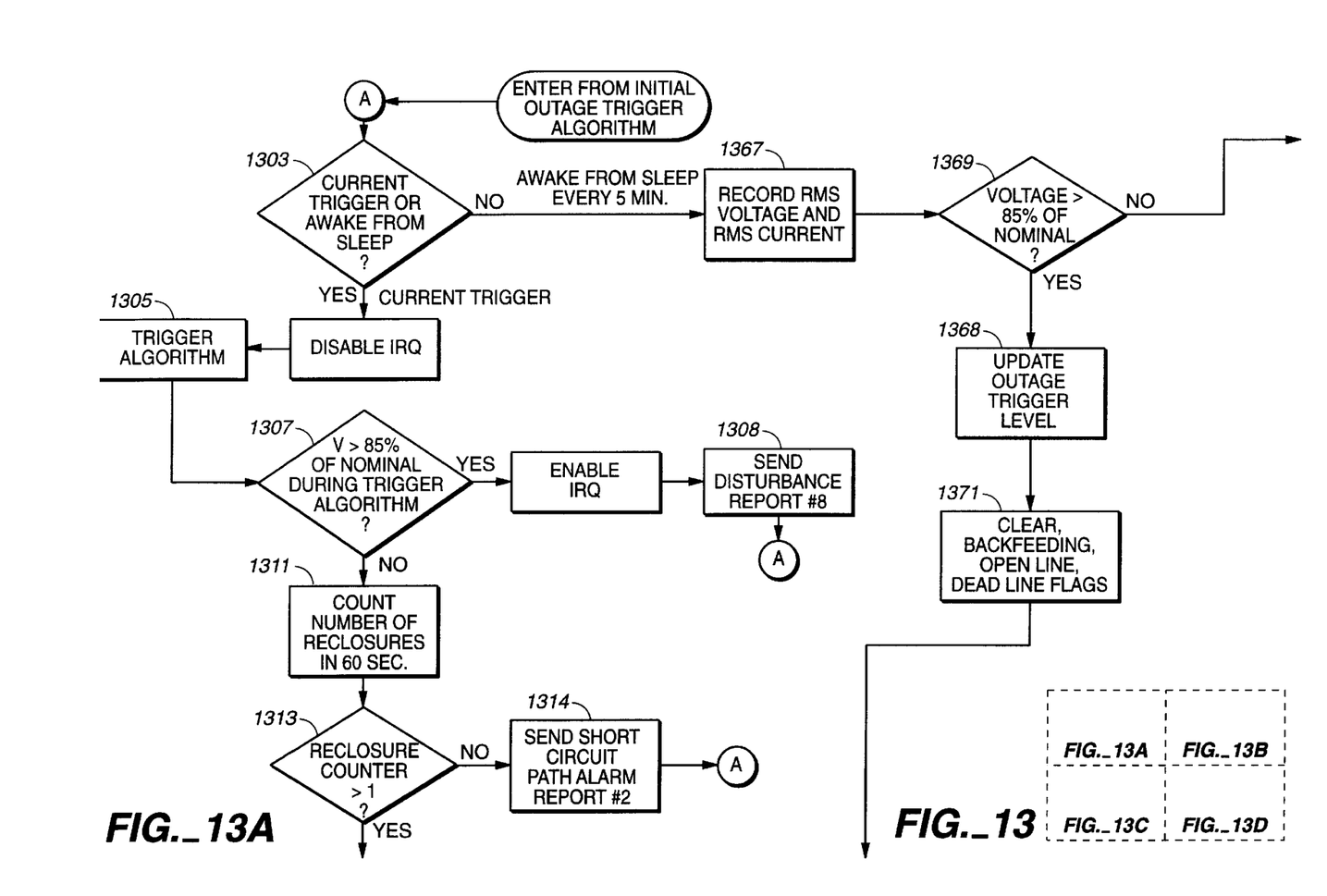
FIG. 13 is a flow chart illustrating a logic flow of the fault sensor device used to distinguish between various faults and conditions.
Figure 13B:
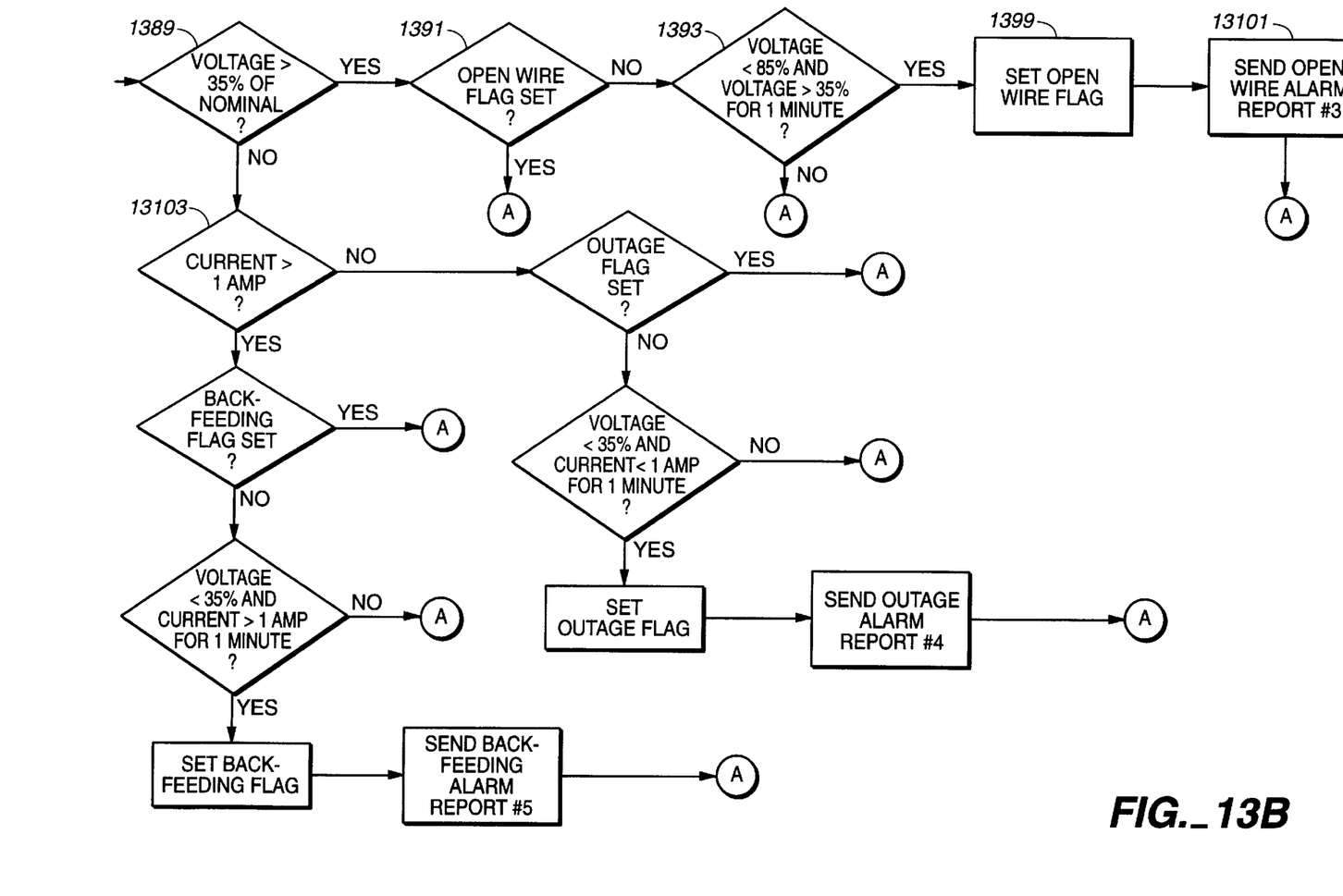
Figure 13C:
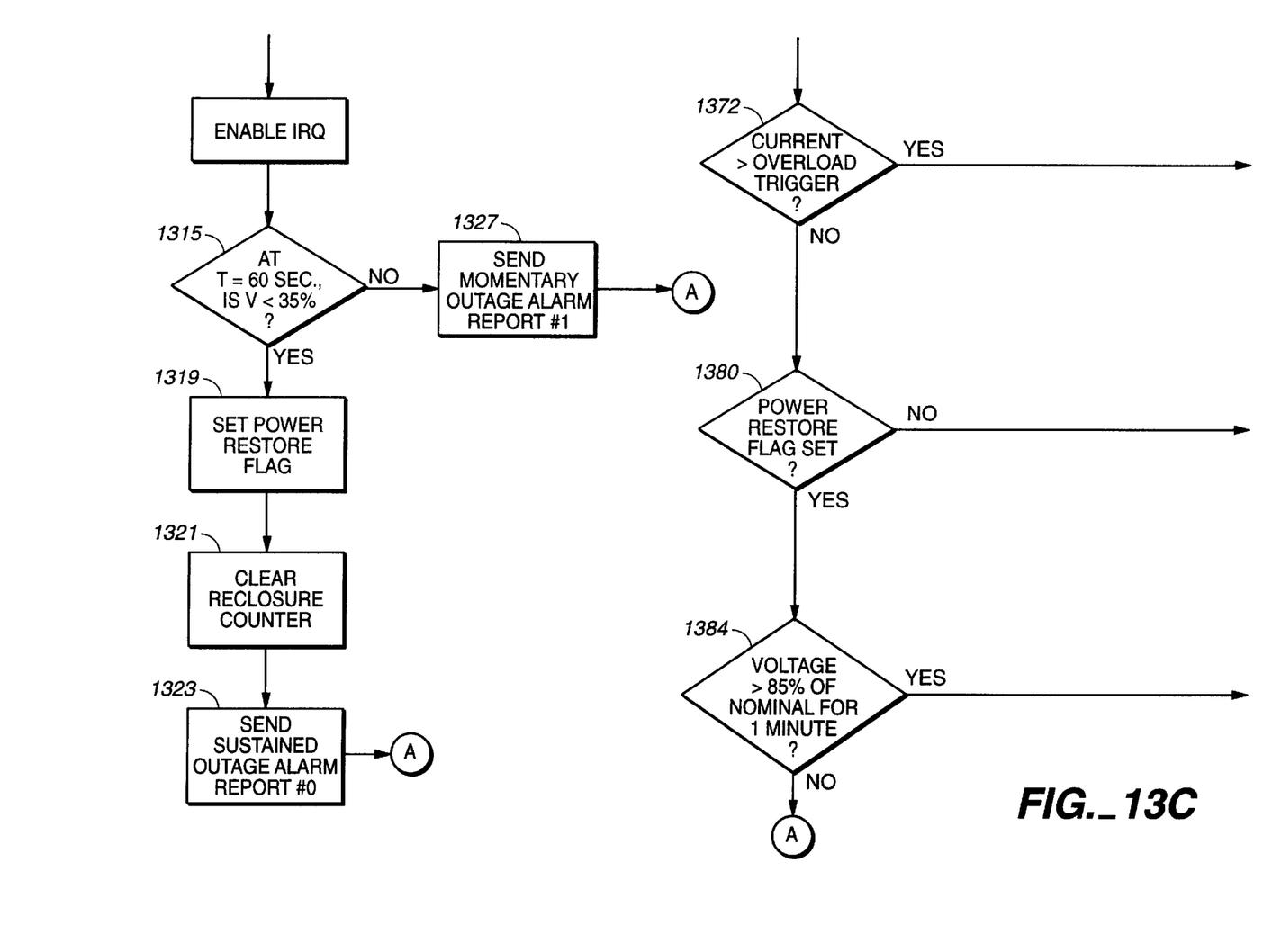
Figure 13D:
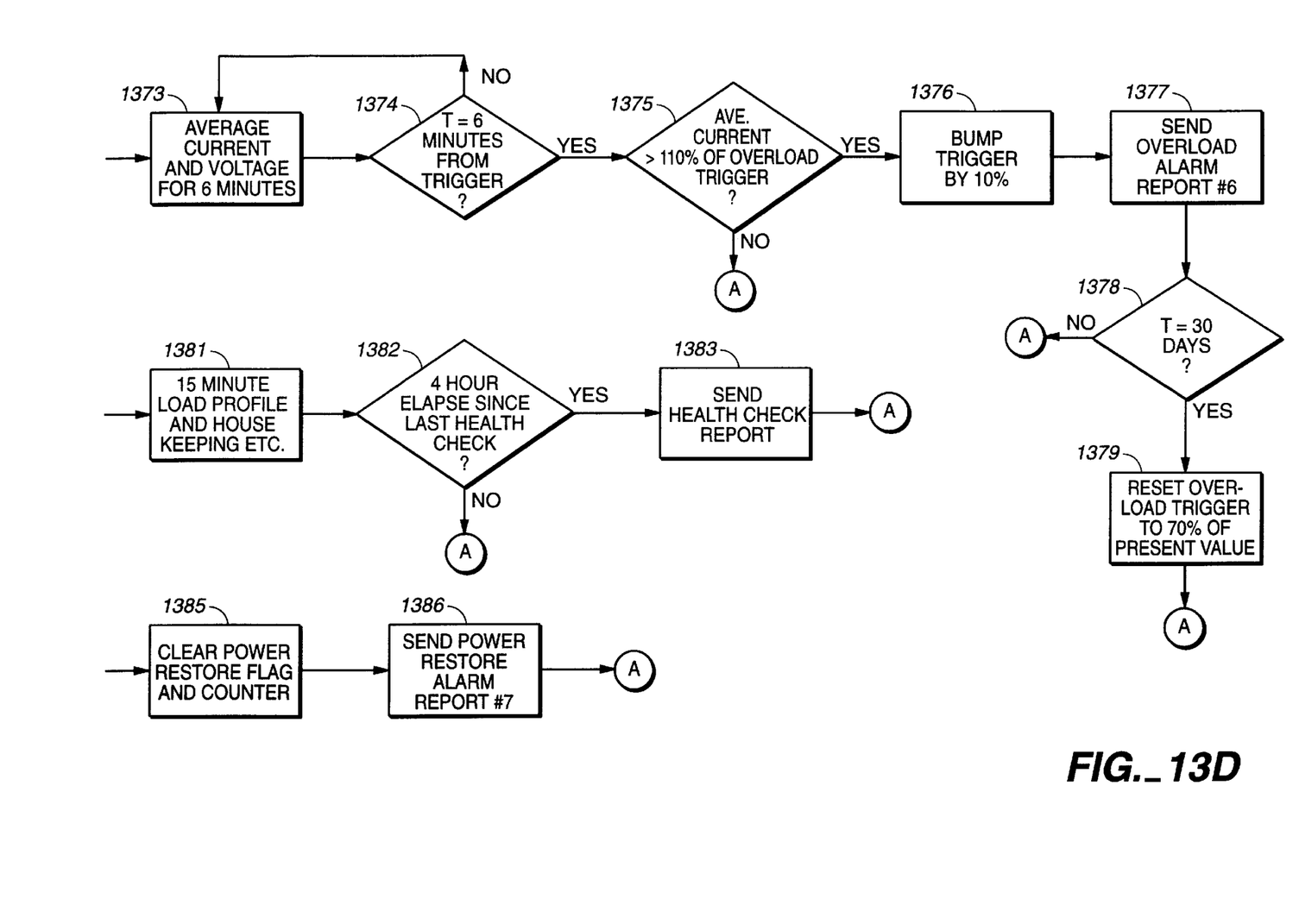

Referring now to FIG. 13, a detection algorithm employed by the fault sensor will be described in detail. The fault sensor system is assumed to initially be in a sleep state. In the sleep state, the fault sensor continuously monitors current and voltage. The fault sensor "wakes up" in order to perform additional processing in three instances: in response to a trigger current, at periodic timed intervals, or to perform a daily health-check routine.

The fault sensor makes a voltage measurement every 5 minutes and compares it with the previous stored reference. The previous reference value is comprised of the last two readings. If the voltage measurement is greater than or equal to plus or minus 15% of the previous reading, the previous reference value is retained. If not then the measured value is used to calculate a weighted average which becomes the new or updated reference voltage value. Thus the nominal voltage level=(V1+1.5(V2)+2(V3))/4.5, where V1 and V2 are the two previous values and V3 is the latest sampled voltage.

Every 15 minutes, the current is also sampled and stored. After a twelve hour period, 96 sampled current and voltage readings are sent out with the health report packet. The 96 samples include 48 readings from the previous 12 hour period. The health packet includes such things as sensor identification, disturbance readings, battery voltage, the 96 current and voltage readings and other data used in evaluating the condition of the sensor.

Referring still to FIG. 13, if a current threshold break has occurred (1303), a trigger algorithm is executed (1305) in which the average line voltage over some number of cycles (e.g., 6 cycles) is determined. If the voltage as determined by the trigger algorithm is less than 85% of the nominal line voltage (1307), then a possible short-circuit current situation exists. The fault sensor then counts the number of reclosures, i.e., the number of times that the line is de-energized, during the following 60 second period (1311). The line is considered to be de-energized if current is less than some value (e.g., ½ Amp.). A reclosure counter is incremented each time the measured current crosses the predetermined threshold in the downward direction. At the end of the 60 second period, the reclosure counter is checked (1313). If the contents of the counter are greater than one, then the voltage is again checked (1315) to see if the line is presently de-energized. If so, a sustained alarm is indicated. A power restore flag is set (1319) to indicate to the fault sensor that a report is to be generated at such time as power is restored. The reclosure counter is cleared (1321), and a report reporting the sustained alarm condition is generated (1323). After transmitting the report, the fault sensor returns to point A.

If at 60 seconds the line is not de-energized (1315), then a momentary alarm condition is indicated. A report is generated (1327) and transmitted to the distribution control center in real-time. The fault sensor then returns to point A.

If at step 1313 the reclosure counter is not greater than one (indicating a dispersed generator as the source of the short-circuit current), then a distinct short circuit path alarm is sent (1314). The fault sensor then returns to point A.

If at step 1307 the line is not de-energized, then what appeared to be a short-circuit current is determined instead to be simply a disturbance. A disturbance report is generated (1308) and the fault sensor returns to point A.

When the fault sensor wakes up following a five minute sleep period (1303), it first records the TLMS voltage and current (1367). If an adaptive trigger level is employed the trigger level may be adjusted at this point (1368). The fault sensor then checks to see whether or not the voltage is greater than 85% of the nominal voltage (1369). If so, then conditions are deemed to be normal. Various flags and counters are cleared (1371), including a backfeeding flag, an open line flag and a deadline flag. The routine then checks to see whether the current exceeds an overload trigger level (1372). If not, the routine then checks to see whether or not the power restore flag is set (1380), indicating that a power restore report needs to be sent. If the power restore flag is not set, then the voltage and current are logged. Various housekeeping chores are then performed (1381). If four hours have elapsed since a health check report was last sent (1382), then a health check report is sent (1383), and the fault sensor returns to point A. Otherwise, the program execution returns directly to point A. If the power restore flag is set (1380), then the voltage is checked to see whether a normal voltage condition persists for one minute (1384). If not, program execution returns to point A. If so, then the power restore flag is cleared (1383) and a power restore report is sent (1386). A power restore counter is also cleared (1383). The fault sensor then returns to point A.

If in step 1372 the current exceeds an overload trigger level, then the current and voltage are average for six minutes (1373, 1374). If the average current does not exceed 110% of the overload trigger (1375), then execution returns to point A. Otherwise, the overload trigger is bumped by 10% (1376), and an overload alarm report is sent (1377). Every 30 days, the overload trigger is reset to 70% of its current value (1378, 1379).

If in step 1369 the trigger voltage is not greater than 85% of the nominal voltage, then the routine checks to see whether or not the trigger voltage is greater than 35% of the nominal voltage (1389). The voltage being less than 85% but more than 35% of the nominal voltage is indicative of an open wire condition. When an open wire condition is reported, an open wire flag is set such that no further report is sent until after the open line flag has been cleared. If the open line flag is not set (1391), the voltage is checked to see if it remains within a range greater than 35% of nominal and less than 85% of nominal for one minute (1393). If so, then an open line alarm condition is indicated, and the open-wire flag is set (1399). An open wire alarm is then generated (13101), and the fault sensor returns to point A. If the voltage does not remain within the foregoing range for one minute, then execution returns to point A. If in step 1391 the open wire flag is set indicating that an open-wire condition has already been reported, then the fault sensor returns to point A.

If in step 1389 the trigger voltage is not greater than 35% of the nominal voltage, then the routine checks to see whether current is greater than 1A (13103). If the current is not greater than 1A, this indicates an outage. As with the open-wire detection routine however, the fault detection logic is required to confirm that the fault condition has persisted for one minute before a dead line condition will be reported. The program logic is identical in all respects to that previously described with respect to the open line condition.

If the current is greater than 1A (13103), this is indicative of a backfeeding condition. In a backfeeding condition, some amount of fault current flows, but the voltage is greatly reduced. The program logic of the high impedance fault detection portion of the routine follows the same pattern as that of the open line and dead line detection portions of the routine.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

We claim:

1. A method of detecting and signaling power line faults using a fault sensor so as to enable fault detection within a power distribution network that includes distributed generators and a multiplicity of fault sensors, the method comprising the steps of:
   the fault sensor triggering in response to a line condition in which line current exceeds a trigger value;
   during a predetermined period of time following triggering, detecting whether the line becomes substantially de-energized multiple times, indicative of reclosure of circuit protection equipment coupled to the power line; and
   signaling a result of said detecting step.

2. A method of detecting and signaling power line faults using a fault sensor so as to enable fault detection within a power distribution network that includes distributed generators and a multiplicity of fault sensors, the method comprising the steps of:
   the fault sensor triggering if line current exceeds a trigger value; and
   after triggering, collecting information sufficient to distinguish a source of the fault current as being from a public utility portion of the power distribution network or from a distributed generator.

3. The method of claim 2, comprising the further step of during a predetermined period of time following triggering, detecting whether the line becomes substantially de-energized at least once.

4. The method of claim 3, comprising the further step of, after said predetermined period of time has elapsed, detecting whether the line is de-energized.

5. The method of claim 4, comprising the further step of, if the line is de-energized, signaling a sustained outage.

6. The method of claim 5, comprising the further step of registering a sustained outage within the fault sensor.

7. The method of claim 6, comprising the further steps of periodically measuring peak line voltage and peak line current.

8. The method of claim 7, comprising the further steps of:
   repeatedly measuring peak line voltages within a normal range; and
   if a sustained outage is registered, signaling a power restored condition.

9. The method of claim 4, comprising the further step of, if the line is not de-energized, signaling a momentary outage.

10. The method of claim 3, comprising the further step of:
    measuring the line current at a predetermined time following said triggering; and
    if the line did become substantially de-energized during the predetermined period of time, determining whether the line current at the predetermined time was greater than a scaled trigger value.

11. The method of claim 10, comprising the further step of, if the line current at the predetermined time was not greater than a scaled trigger value, signaling a disturbance.

12. The method of claim 11, comprising the further step of increasing the trigger value.

13. The method of claim 12, comprising the further step of averaging the line current over a predetermined period of time, producing an average current value.

14. The method of claim 13, comprising the further step of, if the average current value is greater than a scaled trigger value, signaling an overload condition.

15. The method of claim 13, comprising the further step of, if the average current value is not greater than a scaled trigger value, signaling an overload condition.

16. The method of claim 12, comprising the further step of increasing the trigger value multiple times over the course of multiple trigger events.

17. The method of claim 16, comprising the further step of signaling a remote station when the trigger value has been increased a predetermined number of times within a predetermined time period.

18. The method of claim 17, wherein, after signaling a remote station when the trigger value has been increased a predetermined number of times within a predetermined time period, no further disturbance signal to the remote station is generated for the remainder of the predetermined time period.

19. A method of detecting and signaling power line faults using a fault sensor so as to enable fault detection within a power distribution network that includes distributed generators and a multiplicity of fault sensors, the method comprising the steps of:
    the fault sensor triggering in response to a line condition in which line current exceeds a trigger value;
    detecting that a sustained power outage condition exists;
    detecting that the sustained power outage condition has ceased and that power has been restored; and
    sending to a remote location an indication that power has been restored.

20. A method of using a fault sensor including a microprocessor within a power distribution network that includes distributed generators and a multiplicity of fault sensors, the method comprising the steps of:
    under control of the microprocessor, monitoring line conditions and the condition of the fault sensor; and
    sending to remote location a digital data signal including at least one of the following: a number of times the line was de-energized within a predetermined period of time; an indication that power has been restored following a sustained outage; and an indication that battery power is low.

21. A power line fault sensor that executes a stored program, the stored program including computer instructions for:
    triggering the fault sensor in response to a line condition in which line current exceeds a trigger value; and
    collecting information sufficient to distinguish a source of the fault current as being from a public utility portion of the power distribution network or from a distributed generator.

22. A method of detecting a live-wire fault of a power transmission line using a fault sensor, the method comprising the steps of:

periodically determining line voltage;

detecting abnormally low voltage on the power transmission line; and signalling one of multiple backfeeding fault conditions depending on the voltage level of the abnormally low voltage.

23. The method of claim 22, wherein the voltage is detected to be within a range of approximately 35% to 50% of normal, indicative of a backfeeding condition.

24. The method of claim 22, wherein the voltage is detected to be approximately 35% or less of normal, while current persists, indicative of one of a backfeeding condition and an energized line down on the ground.

* * * * *